United States Patent [19]

Valind

[11] Patent Number: 5,684,808
[45] Date of Patent: Nov. 4, 1997

[54] SYSTEM AND METHOD FOR SATISFYING MUTUALLY EXCLUSIVE GATING REQUIREMENTS IN AUTOMATIC TEST PATTERN GENERATION SYSTEMS

[75] Inventor: Thomas S. Valind, New Brighton, Minn.

[73] Assignee: Unisys Corporation, Blue Bell, Pa.

[21] Appl. No.: 530,782

[22] Filed: Sep. 19, 1995

[51] Int. Cl.$^6$ .................................................. G01R 31/28
[52] U.S. Cl. ............................ 371/22.3; 371/27; 364/489
[58] Field of Search ........................... 371/22.3, 27, 25.1, 371/22.1, 22.6, 22.5; 395/183.01, 183.09, 182.13; 364/489, 488, 491

[56] References Cited

U.S. PATENT DOCUMENTS

| | | | |
|---|---|---|---|
| 3,783,254 | 1/1974 | Eichelberger | 235/152 |
| 4,051,352 | 9/1977 | Eichelberger et al. | 364/716 |
| 4,063,078 | 12/1977 | Das Gupta et al. | 364/700 |
| 4,071,902 | 1/1978 | Eichelberger et al. | 364/716 |
| 4,293,919 | 10/1981 | Dasgupta et al. | 364/716 |
| 4,298,980 | 11/1981 | Hajdu et al. | 371/25 |
| 4,503,386 | 3/1985 | DasGupta et al. | 324/73 |
| 4,764,926 | 8/1988 | Knight et al. | 371/25 |
| 5,177,440 | 1/1993 | Walker, III et al. | 324/158 |
| 5,202,889 | 4/1993 | Aharon et al. | 371/27 |
| 5,278,842 | 1/1994 | Berry et al. | 371/22.3 |
| 5,331,570 | 7/1994 | Bershteyn | 364/489 |
| 5,430,736 | 7/1995 | Takeoka et al. | 371/23 |
| 5,446,742 | 8/1995 | Vahabi et al. | 371/27 |
| 5,457,697 | 10/1995 | Malleo-Roach et al. | 371/27 |
| 5,502,731 | 3/1996 | Meltzer | 371/27 |
| 5,528,604 | 6/1996 | El-Maleh et al. | 371/27 |

OTHER PUBLICATIONS

Shi Yin et al; An Algorithm for test generation of combinational circuit-Research an implementation for critical path tracing; IEEE Publication, Asian test Symposium 1993.

Electronic Magazine Article: Yurash, Stephen, et al. Automatic Test Pattern Generation Comes of Age, Sep. '91, pp. 35–38.

Electronic Magazine Article: Derbyshire, Katey, Automatic Test Pattern Generation, Oct. 1993, pp. S57–S62.

*Primary Examiner*—Robert W. Beausoliel, Jr.
*Assistant Examiner*—Nadeem Iqbal
*Attorney, Agent, or Firm*—Charles A. Johnson; Mark T. Starr

[57] ABSTRACT

Mutually Exclusive Gating (MEG) requirements arising from the use of level Sensitive Scan Design (LSSD) rules are satisfied for handling clock phase conflicts in an integrated circuit design. Automatic generation of test patterns for hardware testing of a manufactured integrated circuit is completed without adding logic to the integrated circuit's design. The automatic test pattern generation (ATPG) system identifies and traces cones of logic from a detailed description of an integrated circuit's design. The system also identifies portions of cones that are functional data, clock, and enable input nets. Multiple cones are grouped into partitions. During partitioning, input latches of a cone being driven by the same functional clock as an apex latch of the cone are identified. A net list is created for each partition. Input latches and apex latches having common functional clocking are replaced by 2-1 selectors and AND gates in the ATPG's internal data structures to produce the MEG condition, thereby allowing correct test pattern generation without addition of logic to the circuit design.

22 Claims, 9 Drawing Sheets

SYSTEM AND METHOD FOR SATISFYING MUTUALLY EXCLUSIVE GATING REQUIREMENTS IN AUTOMATIC TEST PATTERN GENERATION SYSTEMS

BACKGROUND OF THE INVENTION

1. Field of the Invention

This invention relates generally to electronic design automation (EDA) systems used for designing complex integrated circuits. The invention is more specifically related to satisfaction of the Level Sensitive Scan Design (LSSD) Design For Test (DFT) mutually exclusive gating (MEG) requirement for automatic test pattern generation (ATPG) during the integrated circuit design process.

2. Background Information

After an integrated circuit, such as an Application Specific Integrated Circuit (ASIC), is manufactured, and prior to shipping to users, the integrated circuit is electronically tested by a computerized tester to verify that no faults or defects exist in the circuitry. Once an integrated circuit has been packaged, it must be treated as a black box having u finite number of inputs and outputs. Unlike a printed circuit board, access cannot be obtained to intermediate points in the circuit unless they are brought out to one of the package pins. The operation of testing requires that certain input conditions are to be applied to the circuit and the resultant output conditions are to be compared with those predicted by simulation or those generated by a known good circuit to which the same input conditions have been applied.

Testing a digital integrated circuit requires that the circuit be exercised in such a way as to validate its required functionality and identify any faults present in the circuit. Faults within u circuit can take many physical forms and can be produced by a variety of problems during processing and operation of the circuit. For many physical faults, the terminal effect of these faults is modelled by the stuck-at fault model. A circuit node is said to be stuck-at-0 (s-a-0) or stuck-at-1 (s-a-1) if the application of a pattern at the primary inputs, which should drive the node to a logic 1 or logic 0 level, fails to produce the expected change at the output. Functional testing of a digital integrated circuit verifies that when a particular pattern or sequence of patterns is applied to the circuit's inputs, the circuit will produce the desired pattern or sequence of patterns at its outputs. Ideally, the applied patterns should exercise each internal node of the circuit in order to establish whether one or more stuck-at faults exist. The two stages of establishing an appropriate set of test stimuli include generating a set of test vectors or test patterns, and evaluating the fault coverage of the set.

When generating sets of test patterns, it is usually assumed that a single stuck-at fault is present in the circuit. Assuming that a particular node is stuck at 0 or 1, a combination of inputs is selected which will cause this node to be set to the opposite (1 or 0), fault-free state. Other inputs are set as to propagate the state of the node being tested to one or more primary outputs so that its condition can be observed. Manual generation off appropriate sequences of input patterns to exercise all of the nodes in a complex integrated circuit is impractical. Hence, automatic test pattern generation (ATPG) techniques were developed. In combinational circuits, where the current output state depends truly on the current state of the inputs, it is possible to perform exhaustive testing by applying all possible combinations of inputs to the circuit, in order to verify the circuit's truth table. Unfortunately, the time taken to perform this type of test becomes excessive as the number of inputs increases.

In practice, the presence of a stuck-at fault at every node can be detected using a reduced, carefully chosen set of test patterns, resulting in a significantly smaller test time. Typically, however, circuits will include one or more feedback loops and a number of bistable storage elements. For this type of circuit, an exhaustive test is likely to be even more impractical because of the need to check the sequential operation for all possible sequences of combinations of input patterns to the storage elements.

Various methods of deterministic generation of non-exhaustive test sets are known. These methods usually produce a reduction in the size of the test set while providing maximum fault coverage. These methods have been implemented in software to form the basis of current ATPG programs. As the test pattern generation task for a large integrated circuit is non-trivial. ATPG programs often require many hours of processing time to produce a set of test patterns with acceptable fault coverage. The overall objective is to spend the smallest amount of time generating a minimal set of test patterns which will give the maximum fault coverage. A minimal set of test patterns is one which can be applied by automatic test equipment in a reasonable test time.

Before an ATPG is used to generate test patterns, it is often helpful for the integrated circuit design to be divided into small sections of logic called cones. Each cone of logic design includes a section of the logic design of the integrated circuit defined by a path from at least one logic designer-defined apex to at least one logic designer-defined base affecting that apex. An apex is either an internal flip-flop or an ASIC output pin. A base is either an internal flip-flop or an ASIC input pin. FIG. 1 is a prior art diagram of a fragment of an integrated circuit design example. FIG. 1 shows a logic cone 10 built around Flip-Flop E 12. The logic cone also includes all of the combinational logic feeding Flip-Flop E 12, and the other flip-flops (A, B, C, D, and E numbered 14, 16, 18, 20 and 22, respectively) feeding the combinational logic. For test purposes, Flip-Flop E 12 can be termed the "output" flip-flop, and Flip-Flops A, B, C, D, and E can be thought of as "input" flip-flops.

During hardware verification, each test pattern generated by the ATPG is applied to the integrated circuit in the following manner. First, the integrated circuit is placed into a "scan shift" mode. The ATPG test pattern is shifted into the requisite input scan set flip-flops or latches. The integrated circuit is then placed into a functional mode. The input pins are set according to the selected test pattern. Next, the functional clock is issued according to the selected pattern to capture the expected value in the output scan set flip-flop or latch. The integrated circuit is again placed into shift mode. Finally, the capture value is scanned out and compared with the ATPG expected value. If an unexpected logic level is captured in the output flip-flop, a hardware defect is assumed to exist in the integrated circuit.

As mentioned above, after each test pattern is scanned into the input flip-flops, the hardware tester will generate a clock pulse to a given output flip-flop. If the functional clock issued also clocks data into any of the input flip-flops, the input test pattern will be corrupted. Furthermore, a race condition will be created in which the erroneous test pattern will propagate to the output flip-flop. If the erroneous test results are captured in the output flip-flop, a false fault will be reported as a result of the hardware test.

The cone of FIG. 1 can be used to demonstrate the problem described above. Assume that a pattern of all zeroes is scanned into Flip-Flops A, B, C, and D, labelled 14, 16, 18, and 20, respectively. A value of one is scanned into Flip-Flop EE 22 to enable Flip-Flop E's 12 clock. All other signals are considered to be "don't cares". Finally, a Phase 1 Clock pulse is issued on Net 24. Based on this logic example, the result captured in Flip-Flop E 12 should be zero. If a "one" is captured instead, it will be assumed that a net in the cone is stuck-at-1. This may not be the correct assumption. Since the state of Flip-Flop EA 26 is considered a "don't care" condition (and thus could be a logic value of one during the test), Flip-Flop E 12 and Flip-Flop A 14 could both be clocked when the functional clock is issued. Since the data input for Flip-Flop A 14 is a "don't care", Flip-Flop A 14 could change states. If the changed state of Flip-Flop A propagates to the data input of Flip-Flop E 12 prior to Flip-Flop E receiving the clock, an erroneous test result is obtained.

To prevent this false fault from occurring, International Business Machines (IBM) Corporation developed the Level Sensitive Scan Design (LSSD) design rules. Information on LSSD is disclosed in U.S. Pat. No. 3,783,254, granted to Eichelberger. These rules require logic designers to incorporate mutually exclusive gating (MEG) into all logic designs wherever there could be a clock phase conflict. If an input rank of flip-flops and an output flip-flop have the same functional clock, then the clock must be disabled to the input flip-flops at the time the output flip-flop is clocked. More formally, whenever one scan set latch drives the functional logic input of another scan set latch and both latches are clocked by the same functional clock phase, then there is an LSSD requirement to add MEG into the design. Logic satisfying MEG requirements is added to the design to ensure that both latches can never be functionally clocked at the same time. FIG. 2 is a prior art diagram of the design example of FIG. 1 after application of Mutually Exclusive Gating (MEG) requirements. The resulting circuit includes additional nets connecting the Inverter 28 which was added to fulfill MEG requirements. The inverter is added by the logic designer to tap off the clock enable driving Flip-Flop A 14 and operate as an enable condition to the apex Flip-Flop E 12. These nets force the ATPG to trace the logic all the way back to Flip-Flop EA 26 when generating the clock enable for Flip-Flop E 12. Note that the logic Cone 30 now contains different logic components than the Cone 10 of FIG. 1. Since Flip-Flop EA 26 must be scanned to a zero before Flip-Flop E 12 can be clocked, the state of Flip-Flop EA 26 is no longer a "don't care" value. Flip-Flop EA 26 will be scanned to zero during any test in which Flip-Flop E 12 is clocked, thus Flip-Flop A 14 will not be chocked also.

Although this technique solves the problem of a false fault occurring due to a clock phase conflict, it adds a large amount of functionally unnecessary logic to the design. It is important to note that the Inverter 28 and associated nets are permanently added to the logic design solely so that when the ATPG is performed, a valid test pattern can be generated to test the manufactured integrated circuit. The added logic does not perform any useful function during operation of the integrated circuit. Obviously, the added logic has a cost in terms of area unnecessarily taken up on the integrated circuit wafer. More importantly, the logic designer must carefully analyze the logic design and identify all points in the logic design of the integrated circuit where the clock phase conflict discussed above could occur. The logic designer then permanently changes the design to avoid the clock phase conflict during testing by inserting the inverter and associated nets. However, with current 0.5 micron Complementary Metal-Oxide-Semiconductor (CMOS) technology, a logic design may contain thousands of cones and up to 30,000 scan set flip-flops. Furthermore, it is common for a cone's output flip-flop to sham the same functional clock as at least one of the input flip-flops. There could be thousands of instances where one flip-flop or latch functionally drives another latch and both are clocked by the same functional clock phase. Therefore, it may be necessary to add thousands of extra nets and gates to comply with MEG requirements. The logic designer must find all of these instances and add logic to the design to ensure the driving latch cannot be clocked at the same time as the receiving latch. This test engineering activity for avoiding clock phase conflicts imposes a significant burden on the logic designer and increases the integrated circuit design cycle time. Any technique to reduce or eliminate this burden would be a valuable advance in the electronic design automation art.

SUMMARY OF THE INVENTION

An object of this invention is to decrease the integrated circuit design cycle time.

A further object of this invention is to automatically identify clock phase conflicts inherent in a logic design.

Another object of this invention is to eliminate the need for adding components and nets to a logic design to satisfy Mutually Exclusive Gating (MEG) requirements for clock phase conflicts arising during the testing of an integrated circuit.

Still another object of this invention is to decrease the amount of components and nets in an integrated circuit design by eliminating inverters and associated nets inserted into the design solely to comply with MEG requirements to support ATPG processing.

Yet another object of this invention is to automatically generate test patterns for testing integrated circuits that do not cause false fault conditions to be detected because of clock phase conflicts in the design.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended claims.

According to the present invention, the foregoing and other objects and advantages are attained by a novel method for satisfying mutually exclusive gating requirements during automatic test pattern generation processing without adding components and nets to the circuit design. Generally, the method of generating a test pattern for testing an integrated circuit includes the steps of identifying a group of components and nets of the integrated circuit, identifying any clock phase conflicts inherent in the group, building a list of components and nets for the group such that the clock phase conflicts are eliminated for the group and no components or nets are added to the integrated circuit, and generating test patterns for testing the group based on the list. The method uses a detailed description of the circuit design, which includes names for components and nets of the circuit. The nets of the circuit may be base nets input to the circuit, apex nets output from the circuit, or nets internal to the circuit. The circuit has at least one functional clock and a plurality of scan set latches.

The steps of the method include identifying a plurality of cones of logic design from the logic design of the integrated circuit. Each cone of logic design includes a section of the logic design of the integrated circuit defined by a path from at least one logic designer-defined apex net to at least one logic designer-defined base net affecting the apex net. An apex net is either an internal flip-flop or ASIC output pin. A base net is either an internal flip-flop or ASIC input pin. An input scan set latch is coupled to a base net. An apex scan set latch is coupled to an apex net. All functional data, clock, and enable input nets are identified. The cones are grouped into partitions and any clock phase conflicts are identified. A clock phase conflict could occur when an input scan set latch of a cone and an apex scan set latch of the same cone are driven by the same functional clock of the circuit. A net list is then created flit each partition. Each net list includes the components and nets of the circuit for every cone in that partition. The net lists are constructed in such a way as to satisfy the mutually exclusive gating requirements for any potential clock phase conflicts without adding logic to the circuit design. Instead, the present invention modifies the internal data structures representing the circuit design to ensure MEG requirements are met. Finally, test patterns are automatically generated for the partitions from the net lists.

Still other objects and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of tither and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims.

DESCRIPTION OF THE PREFERRED EMBODIMENT

Figure 1:
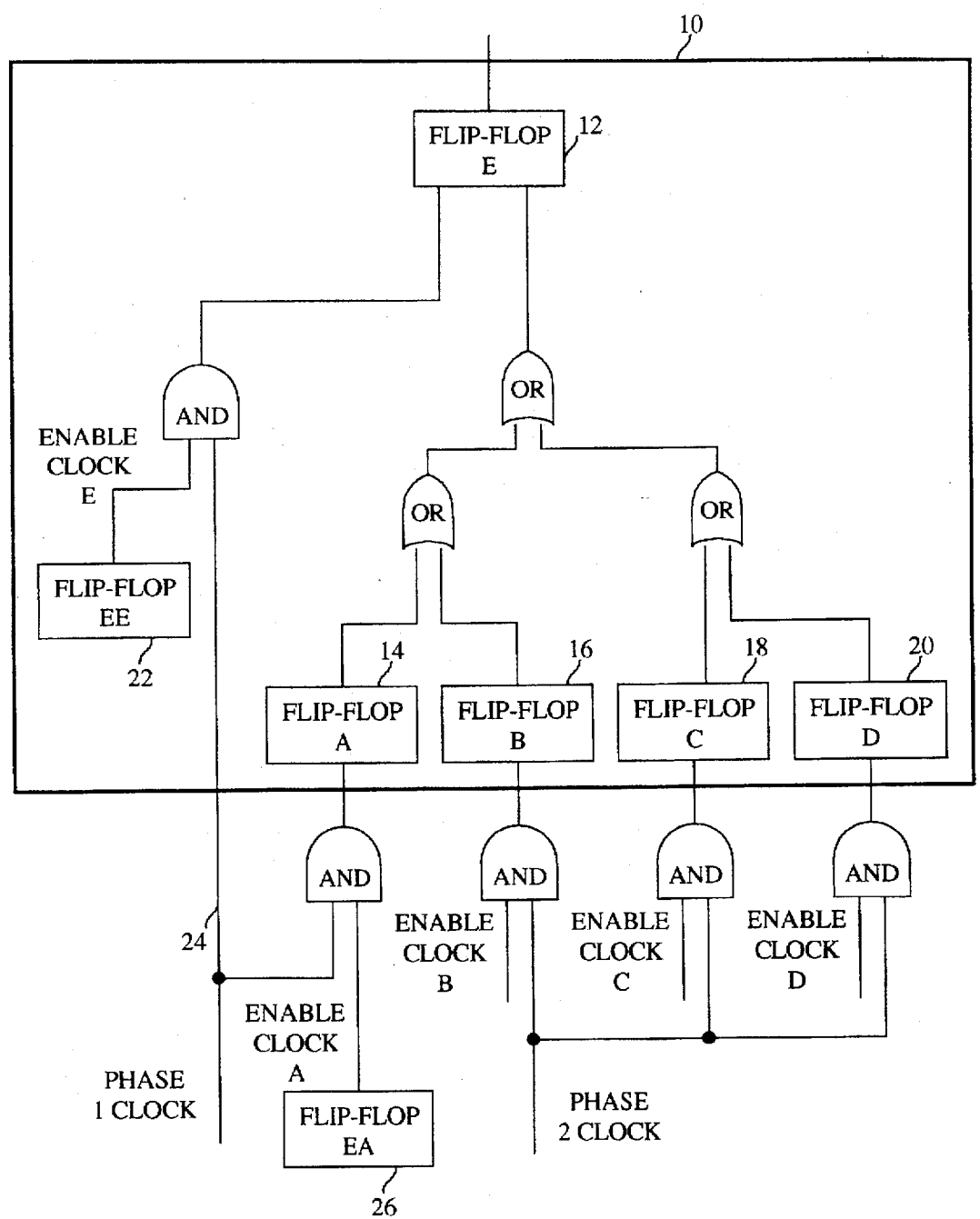
FIG. 1 is a prior art diagram of a fragment of an integrated circuit design example.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method of operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or tither apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Figure 3:
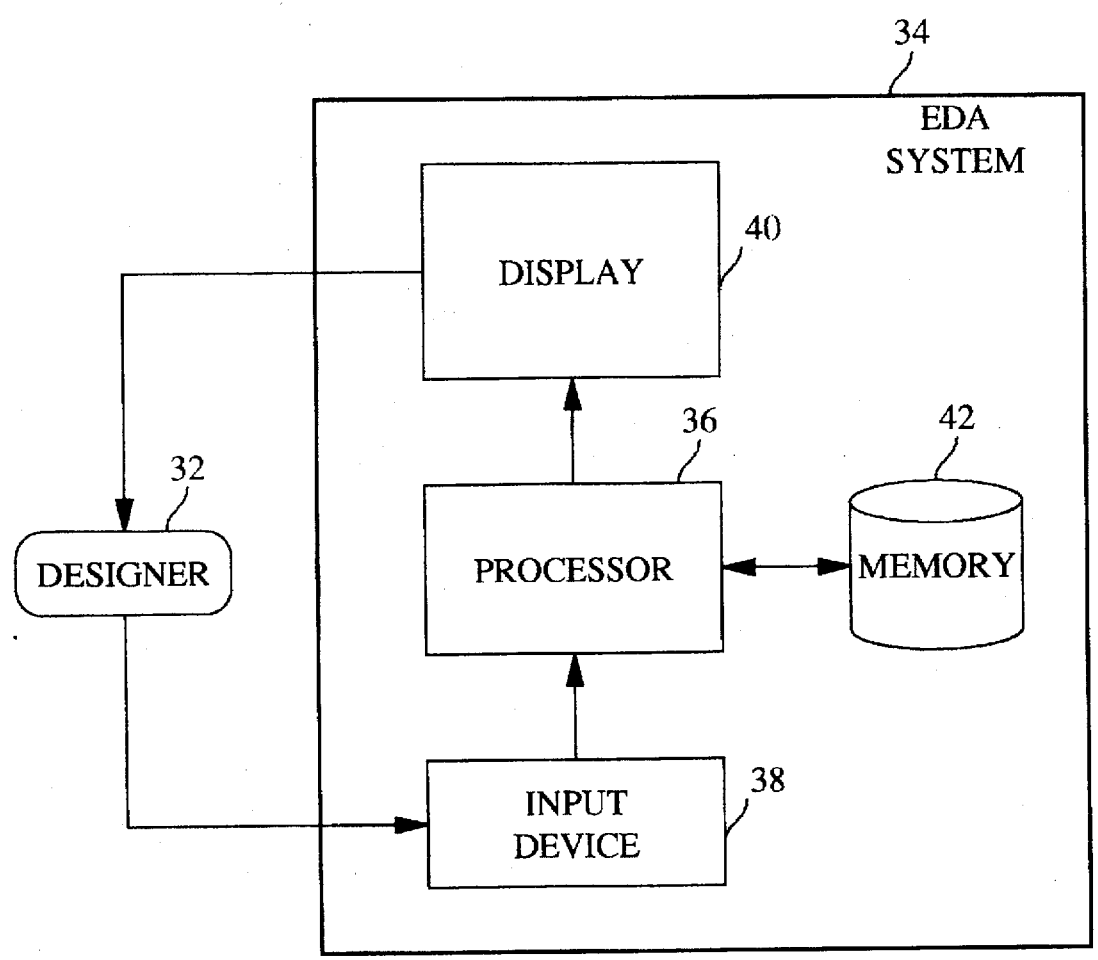
FIG. 3 is a block diagram of the computer-based environment of the present invention.

FIG. 3 is a block diagram of the computer-based environment of the present invention. A Designer 32 interacts with an electronic design automation (EDA) System 34 to enter an integrated circuit design, validate the design, place the design's components on a silicon chip, and route the interconnections among the components. The integrated circuit may be an application specific integrated circuit (ASIC). The EDA System 34 includes a Processor 36, which executes operating system software as well as application programs known as EDA software. The Processor is found in all general purpose computers and almost all special purpose computers. The EDA System 34 is intended to be representative of a category of data processors suitable flit supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc., may also be used. The Designer 32 enters design information into the EDA System using a well-known Input Device 38 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 40. The Display is used to display messages and symbols to the Designer. Such a Display 40 may take the form of any of several well-known varieties of CRT displays. The EDA software being executed by the Processor 36 stores information relating to the logic design in Memory 42. The Memory may take the form of a semiconductor memory, magnetic disks, optical disks, magnetic tape or other mass storage device.

Figure 4:
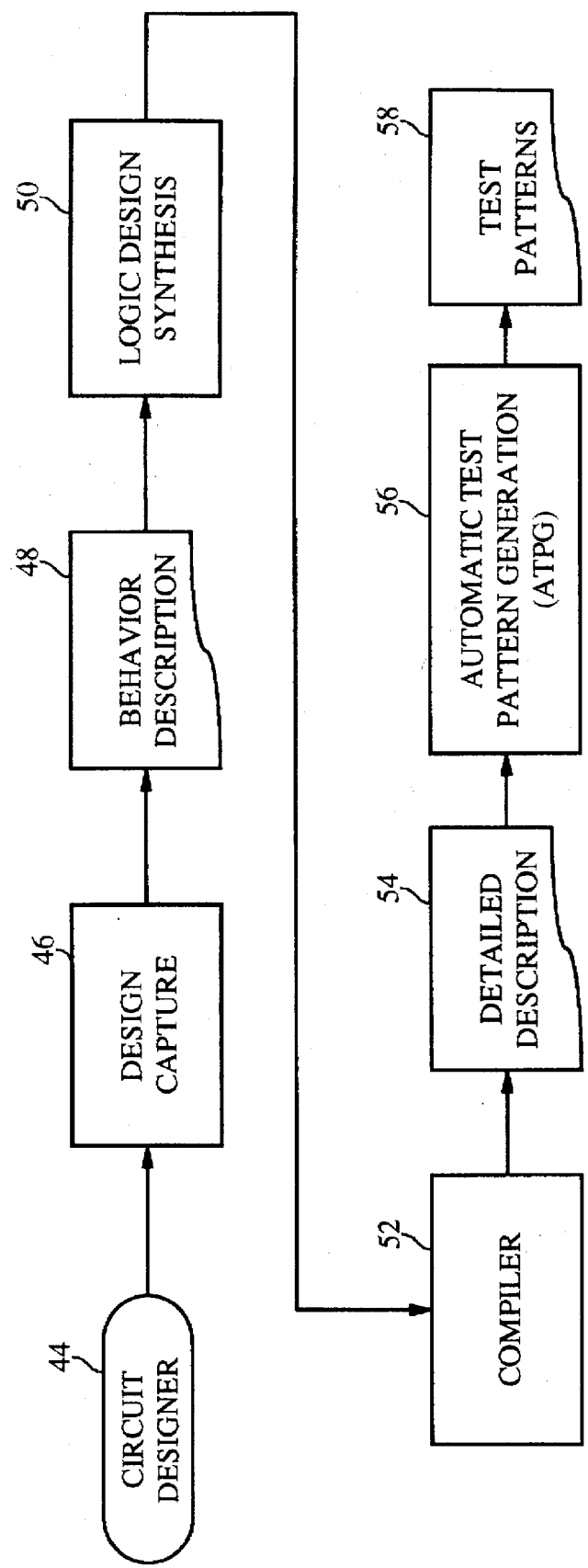
FIG. 4 is a block diagram of the process environment of the present invention.

FIG. 4 is a block diagram of the process environment of the present invention. The Circuit Designer 44 specifies the logic design of an integrated circuit by using Design Capture software 46. The Hardware Computer-Aided Design System (HCADS), available from Unisys Corporation, may be used as Design Capture software 46, although other design capture programs from companies such as Cadence Design Systems, Inc., Synopsys, Inc., and Mentor Graphics, Inc., are also commercially available. The result of this activity is a Behavior Description file 48. The Behavior Description represents the logic design as specified at the register transfer level. Items in the Behavior Description file map to functional components of the design. Each component has a logical name assigned to it by the Circuit Designer 44. The Behavior Description may be written in a design language called Universal Design Source Language (UDSL), which is proprietary to Unisys Corporation, although other existing, well-known hardware design languages could also be used. The Behavior Description is input to Logic Design Synthesis software 50. Logic Design Synthesis software 50 creates the gates and other circuitry needed to implement the design specified by the Behavior Description. The Synthesis software comprises the Behavior to Structure Translator (BEST) synthesis tool developed by Unisys Corporation. However, alternate embodiments such as the VHDL Design Compiler commercially available from Synopsys, Inc., the Design-Book synthesis tool from Escalade, and the Synergy synthesis tool available from Cadence Design Systems, Inc., among others, may also be used. The Logic Design Synthesis software 50 works in conjunction with Compiler 52 to generate the Detailed Description file 54. This file contains the gate-level definition of the logic design. In the preferred embodiment, the Detailed Description file 54 is in Behavior Description Language (BDL) format.

The Detailed Description file 54 is input to a variety of other EDA software tools, only one of which is shown in FIG. 4. Other EDA software tools could include placement and routing tools, timing analyzers, and simulation programs. The Detailed Description 54 is sometimes referred to as the "netlist" for the design. The Detailed Description 54 is input to the Automatic Test Pattern Generation (ATPG) 56 process. The ATPG process generates Test Patterns 58, which are input to computerized test equipment (not shown in FIG. 4) for testing the manufactured integrated circuit.

The use of test patterns may be explained by a simple example. If the logic design consists of a burn map for a small programmable integrated circuit chip (for example, a 20-pin programmable logic array (PLA)), the ATPG 56 generates a list of input combinations that will exercise all of the logic within the chip. After the chip is burned with the logic design, a computerized tester applies the requisite combinations of voltage levels to the chip's input pins. The tester verifies that the expected logic levels appear on the output pins. If an unexpected pattern appears on the output pins, the chip is most likely either defective, or burned incorrectly.

In larger designs (e.g., large application specific integrated circuits (ASICs)), too many levels of logic exist in the design to use test patterns in this way. Instead, the design must be decomposed into smaller sections of combinational logic bounded on either side by scan set flip-flops and ASIC pins. These sections are called "cones". A logic cone is all the logic that drives a cone apex. More formally, a cone is a section of an integrated circuit's logic design defined by a path from at least one logic designer-defined apex to at least one logic designer-defined base affecting the apex. A base is either an internal flip-flop or ASIC input pin. A cone apex is any point in an ASIC or Device Under Test (DUT) that can be observed directly or indirectly by a hardware tester. There are only two types of observable points. One is an ASIC pin which is directly contacted by the hardware tester. The second is internal logic states within an ASIC which can be indirectly observed and/or controlled by a hardware tester via the contacted ASIC pins. These internal logic states are controllable and observable because they are connected in a serial shift register configuration called a scan string. This scan siring configuration usually has nothing to do with the intended function of the ASIC. Scan strings exist to allow a hardware tester to control and observe internal logic states. Each individual logic state that makes up a scan string is called a scan set latch.

Once given a small piece of the entire design (a logic cone), ATPG 56 creates test patterns for only that cone. While creating patterns for that one cone, ATPG does not examine the rest of the design and assumes that the rest of the design will not interfere with the patterns it creates. Mutually Exclusive Gating (MEG) is one of the LSSD design requirements that ensures that the assumption of no outside interference is correct.

Figure 2:
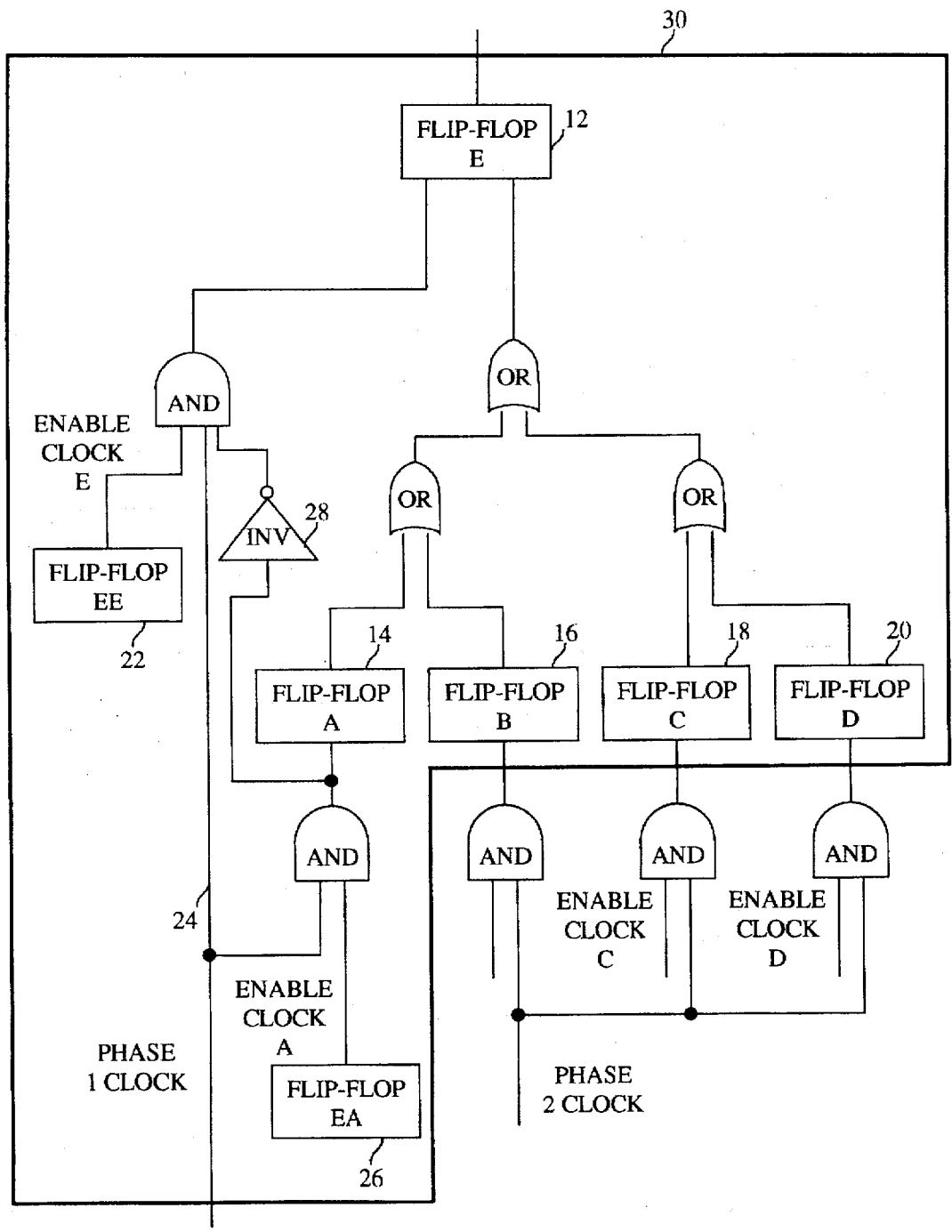
FIG. 2 is a prior art diagram of the design example of FIG. 1 after application of Mutually Exclusive Gating (MEG) requirements.
Figure 5:
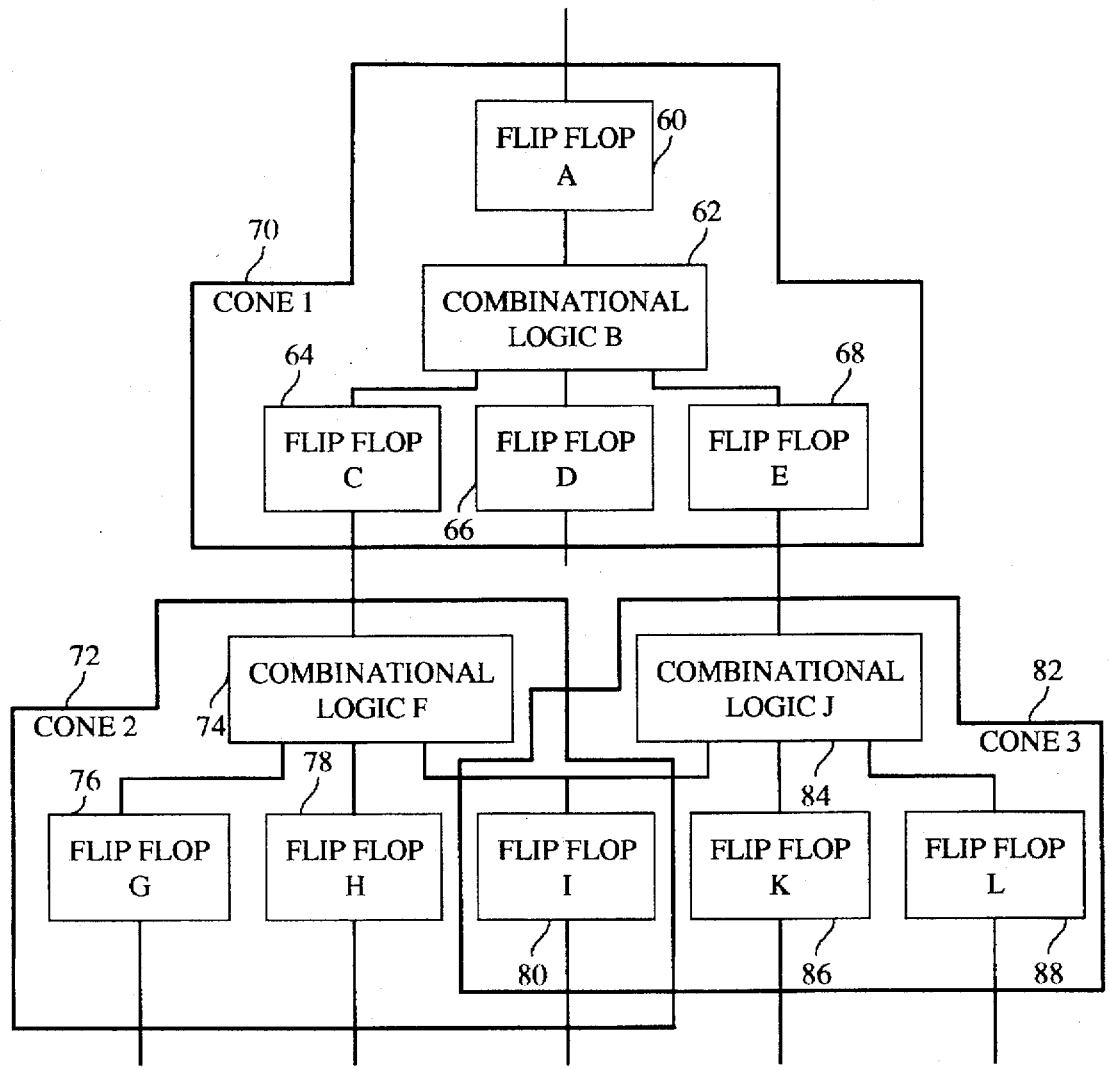
FIG. 5 is a diagram showing an example of tracing logic cones within an integrated circuit.

Logic cone tracing involves starting from a cone apex and tracing backwards (reverse of the functional logic flow) through all of the logic that drives the cone apex until controllable inputs are found. A controllable input is any ASIC or DUT pin or internal slate (scan set latch) that can be controlled by a hardware tester. As with an observable point, an internal state is a controllable input if it is on a scan string. By being on a scan string, it can be controlled indirectly by the hardware tester via the ASIC pins. FIG. 5 is a diagram showing an example of tracing logic cones within an integrated circuit. First, a Flip-Flop A 60 is selected as an apex for a logic cone. All combinational logic feeding this Flip-Flop A 60 is identified (logically traced) and included in the cone, along with all flip-flops feeding the combinational logic. Thus, in FIG. 5, Flip-Flop A 60 is fed by Combinational Logic B 62, and Combinational Logic B 62 is fed by Flip-Flop C 64, Flip-Flop D 66, and Flip-Flop E 68. These components make up Cone 1 70. For test purposes, the selected Flip-Flop A 60 can be thought of as the "output" flip-flop, while the flip-flops feeding the Combinational Logic B 62 are the "input" flip-flops. Similarly, Cone 2 72 is comprised of output Flip-Flop C 64, Combinational Logic F 74, Flip-Flop G 76, Flip-Flop H 78, and Flip-Flop I 80 (Flip-Flop C is not drawn within Cone 2 in FIG. 2 for clarity). Cone 3 82 is comprised of output Flip-Flop E 68, Combinational Logic J 84 and Flip-Flop I 80, Flip-Flop K 86, and Flip-Flop L 88 (Flip-Flop E is not drawn within Cone 3 in FIG. 2 for clarity). Note that Flip-Flop I 80 is input to two different cones. Also note that Flip-Flop C 64 and Flip-Flop E 68 appear as outputs for their own logic cones and inputs to Cone 1 70.

Figure 6:
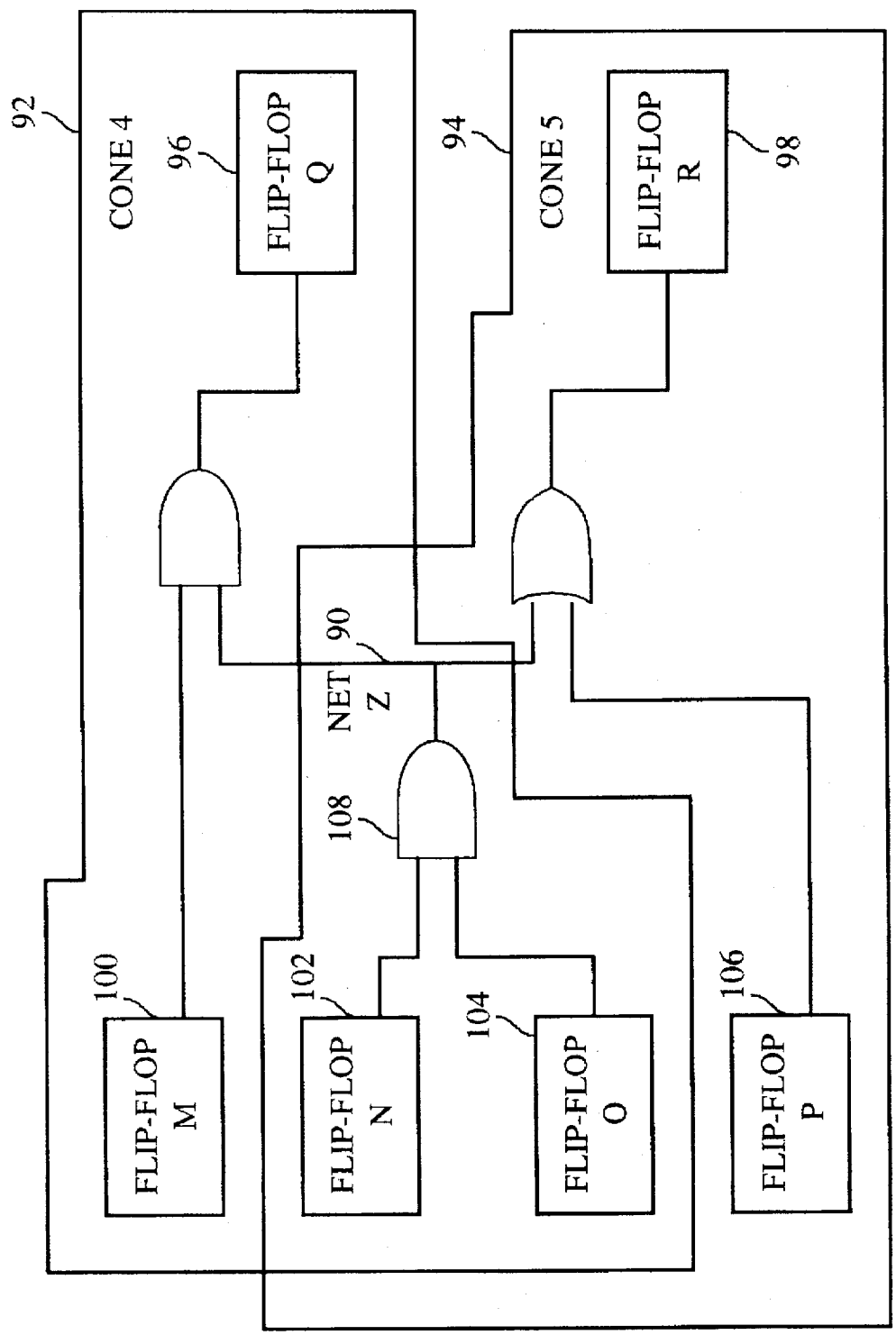
FIG. 6 is a diagram showing an example of two cones that are placed together in a partition.

Once the entire design is divided into cones, the cones are grouped together into sections of logic called partitions. A partition could, for example, consist of one hundred cones. A large ASIC design may consist of thousands of cones, and hundreds of partitions. Dividing the logic and then generating patterns for every partition in the design takes a large amount of processing time. Each partition is then submitted to the ATPG 56 of FIG. 4), which generates test patterns for every net in the partition. When the ATPG generates test patterns, it begins by selecting a particular net in the selected partition. Obviously, the selected net will be part of at least one (but possibly more than one) cone in that partition. FIG. 6 is a diagram showing an example of two cones that are placed together in a partition. Note how Net Z 90 is a part of Cone 4 92 and Cone 5 94. Once a not is selected, the ATPG traces the logic forward to find the selected net's output flip-flop(s). If the net is part of more than one cone, the net will be associated with more than one output flip-flop. For example, in FIG. 6, Net Z 90 can be traced to output Flip-Flop Q 96 and output Flip-Flop R 98. For test generation purposes, the ATPG will select the output flip-flop which is most easily accessible based on predetermined ATPG criteria.

Next, the ATPG finds the input flip-flops associated with the selected output flip-flop. For example, in FIG. 6, if output Flip-Flop Q 96 is selected for Net Z 90, input Flip-Flop M 100, input Flip-Flop N 102, and input Flip-Flop O 104 will be used in the test pattern generation. Finally, the ATPG generates two patterns which can be scanned into Flip-Flop M 100, Flip-Flop N 102, and Flip-Flop O 104. One pattern detects a stuck-at-1 condition for Net Z 90, while the other detects a stuck-at-0 condition. Note that as a part off each pattern the ATPG also determines the enable and clock inputs needed to trap the results of the test pattern in Flip-Flop Q 96. The clock and enable logic is not shown in FIG. 6. During actual hardware test, each test pattern is scanned into the requisite input flip-flops. The necessary clock and enable signals are provided to the selected output flip-flop and the resulting signal is latched. Finally, the latched signal is scanned to an output pin for verification. This process is repeated for every test pattern generated for the partition.

Figure 7:
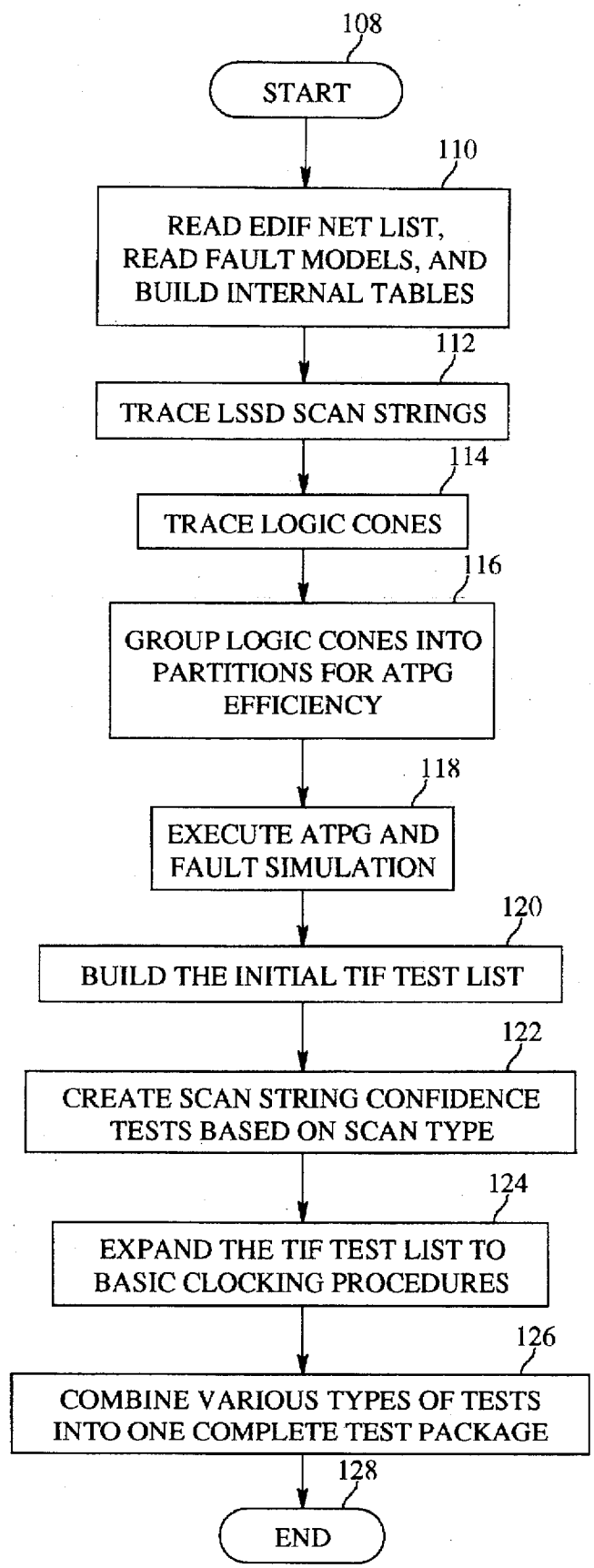
FIG. 7 is a flow chart illustrating the high level steps of ATPG processing.

FIG. 7 is a flow chart illustrating the high level steps of an ATPG process. After Start Step 108, three initialization tasks are performed at Step 110. An Electronic Data Interchange Format (EDIF) netlist is read from an external file from Memory 42, the fault models are read from an external file from Memory 42, and internal tables (data structures) are built for subsequent ATPG processing. In the preferred embodiment, only EDIF netlists are accepted. However, in alternate embodiments, other net lists could be used such as those in Verilog or VHDL formats. The EDIF netlist can be hierarchical or flat, and there can be one or many separate EDIF files describing the logical design of the integrated circuit. The design does not have to be an ASIC. The leaf level nodes and modules must have fault models for them. After reading in the EDIF netlist, at Step 112, the level sensitive scan design (LSSD) scan strings are traced at the fault model primitive level. For each scan string, all control signals are simulated first, and then the scan path from a Scan Data Out (SDO) ASIC pin to a Scan Data In (SDI) ASIC pin is traced. The LSSD approach is one of several which allows the internal flip-flops to be indirectly observable by a maintenance processor or hardware tester. Once all of the scan-set and ASIC pin targets are identified, the logic that drives them are traced. Thus, at Step 114, all logic cones are traced. For cones where a scan-set latch is the apex, the functional/design logic and the scan string maintenance logic are traced.

At Step 116, compatible logic cones are grouped together into partitions. Each partition is given a name which is used in generated reports and can be used to interact with the ATPG program. The ATPG focuses on creating partitions based on the logical registers within a design, not individual flip-flops or latches. Logic cones are grouped into partitions based on logical registers primarily to boost ATPG efficiency. By creating partitions that are identical to logical registers in a design, ATPG processing time is reduced and a more meaningful logic grouping is presented to the designer for further analysis. This step is accomplished by looking for vector nets that are driven by latches on a scan string.

At Step 118, test patterns are created for each logic partition by executing an ATPG algorithm. The patterns are then fault simulated to determine which faults are detected by the pattern. The netlists for each partition are given to the ATPG and fault simulator one at a time. Test patterns are generated for the design logic only. At Step 120, the test patterns are translated into a Tester Independent Format (TIF). TIF is a robust proprietary language developed by Unisys Corporation. The language syntax allows for procedure calls, loops, and condition statements. The patterns created for each partition are placed into their own TIF section in the test list. Each section is flagged by the name of the partition. At Step 122, a set of scan string confidence vectors are created. The vectors are in the TIF language format and placed into a file separate from the ATPG produced patterns. Vectors are created for every scan string. The vectors ensure each scan string is operating correctly. The patterns include all 0's, all 1's, sliding 0's and 1's, and a set of patterns to catch crosstalk. At Step 124, the TIF test list is expanded to a more basic set of clocking procedures. Since the TIF language has higher level procedures (like macro calls, condition statements, and loops), compilation of these calls produce simpler forms to match computerized testing equipment. At Step 126, different TIF test lists are combined into a custom test list. High level ATPG processing ends at End Step 128.

Figure 8:
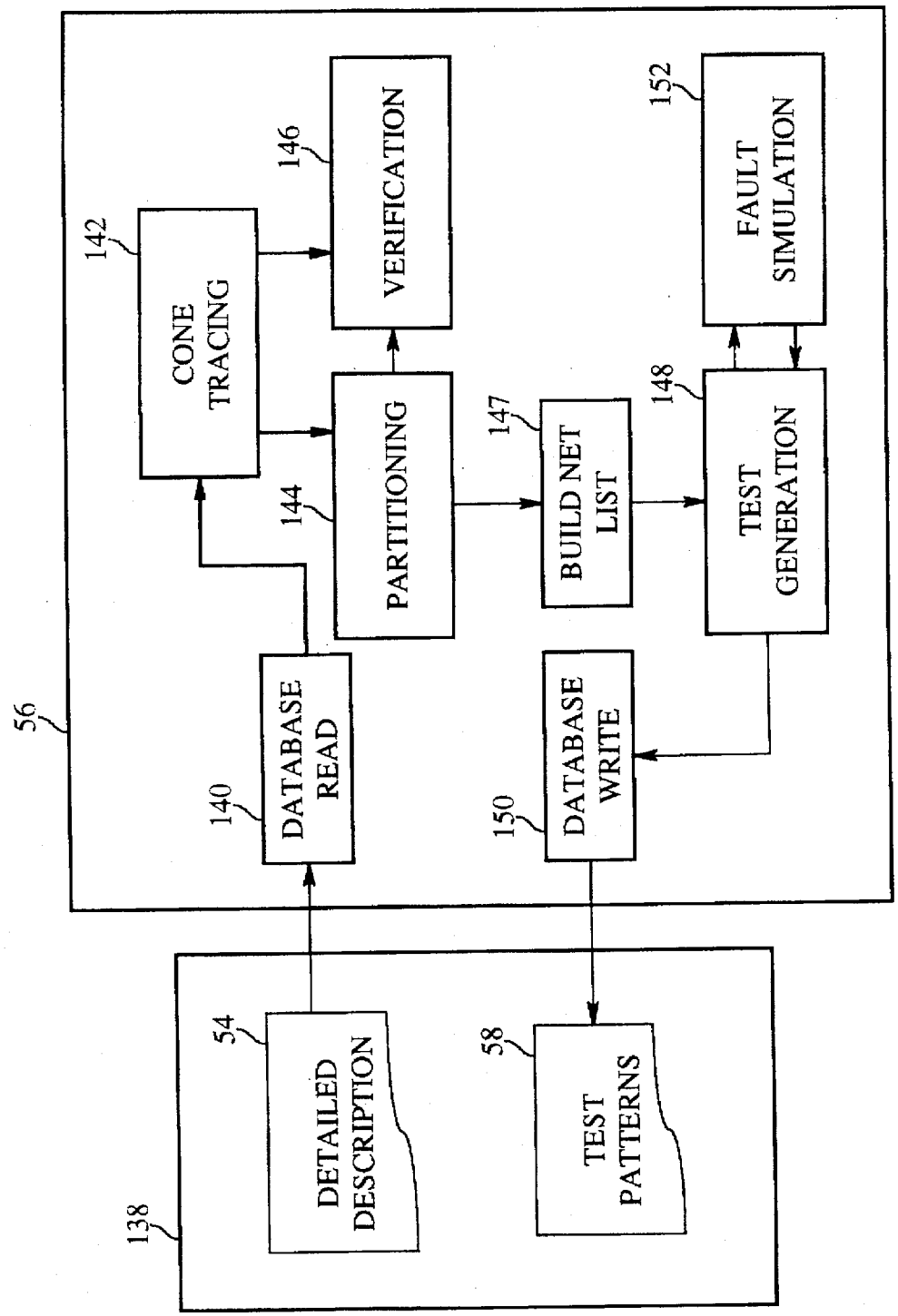
FIG. 8 is a block diagram of the major components of ATPG processing according to the present invention.

FIG. 8 is a block diagram of the major components of an ATPG process according to the present invention. All functions of the ATPG process 56 are executed by Processor 36 as part of the EDA System 34 from FIG. 3. The logic design of the integrated circuit contained in the Detailed Description 54 is read out of the Database 138 by Database Read function 140. The Database is resident in Memory 42 from FIG. 3. The data is input to the Cone Tracing function 142. The Cone Tracing function creates a cone by tracing back through the design from a selected logical register to one or more nets affecting the logical register. There may be many cones created for a given logic design. Generally, the Partitioning function 144 groups cones into sections of logic called partitions. Each partition typically contains many cones.

The Verification function 146 verifies that the logical register cones/partitions traced out during Cone Tracing 142 do not violate any Design For Test (DFT) rules. The Verification function also checks that the number of gates/nodes present in the logical cones are not too large, because extremely large netlists result in poor test generation and fault simulation performance. If, for any reason, the cone is unusable, the tracing is discarded and the cone is retraced as individual cones or as several smaller cones. The Build Net List function 147 constructs a data structure, called a net list, for each partition identified by the Partitioning function. Each net list contains the logic from the integrated circuit design for a partition.

The Test Generation function 148 automatically generates appropriate test patterns to test for faults for each partition created by the Partitioning function 144. Test Generation 148 is given a netlist representing a partition and a list of fault sites. Test Generation picks a fault (that has not yet been detected) from the list and creates a pattern that will excite that fault and propagate it to an output node of the netlist. When creating a pattern, Test Generation 148 is only concerned with that one fault. If Test Generation operations are successful, the newly-created test patterns are stored into Test Patterns 58 in the Database 138 by Database Write function 150.

The task of the Fault Simulation function 152 is to fault simulate the test patterns against the entire netlist to determine all faults detected by each pattern. Detected faults are marked in a fault list and control is given back to Test Generation 148.

Prior to performing the Cone Tracing function, the ATPG process 56 obtains important information from the netlist in the Detailed Description 54 and processing control scripts. Every scan string in the logic design is traced and every internal state that is observable and controllable from a scan string is identified. Every clock source is traced forward to every internal state to identify which clock source(s) drives each internal state.

Table I shows the pseudo code for the Cone Tracing function 142 of FIG. 8 and the Trace Logic Cone step 114 of FIG. 7.

TABLE I

| Pseudo Code for the Logic Cone Trace Function |
| --- |
| 1. LOOP through all scan set latches |
| 2. — All latches logic cone apexes |
| 3.    LOOP through the functional clock, data and enable inputs of this latch |
| 4.      Initialize a cone used node list for this input of this cone apex |
| 5.      Initialize logic cone summary record |
| 6.      Place the current input port(s) of this latch on a trace stack |
| 7.      LOOP until trace stack is empty |
| 8.        Pop off an entry |
| 9.        Get all inputs to that single entity popped from the stack |
| 10.       LOOP through all inputs (all nodes driving the item that was popped.) |
| 11.         IF the entry/node is marked as used THEN discard it |
| 12.         ELSE IF the driving node is a controllable input (scan set latch or ASIC pin) |
| 13.         THEN |
| 14.           IF no DFT violations THEN |
| 15.             Mark it as used |
| 16.             Save information about this input in the cone summary record |
| 17.           ELSE |
| 18.             Mark for Verification function |
| 19.             Erase input list and trace stack (Terminate this trace) |
| 20.           ENDIF (end of DFT check) |
| 21.         ELSE (not previously found and not an input) |
| 22.           Mark as used |
| 23.           Push into trace stack |
| 24.         END IF |
| 25.       END LOOP through inputs |
| 26.      END LOOP (trace stack is empty) |
| 27.    END LOOP (through the individual input ports) |
| 28. END LOOP (of all scan set latches) |

The goal of partitioning is to group the net lists of one bit logic cones together so that the size of the resulting net list is the most optimum for ATPG and Fault Simulation performance. ATPG and Fault Simulation algorithms have an exponential performance curve based on the number of gates/nodes in the net list they work on. Partitioning also improves performance in two other ways. The first benefit is to give an ATPG more options/paths for propagating a potential fault to a cone apex. The second benefit of partitions is that fault simulation of the ATPG pattern may catch many more faults than with a single bit logic cone. Prior art ATPGs will take patterns from a first cone 'X' and simulate them on cone 'Y' and thus get the same results. In the present invention, cone 'X' and cone 'Y' are already together in a partition, so processing steps are saved.

Table II shows the pseudo code for the Partitioning function 144 of FIG. 8 and the Group Logic Cones Into Partition step 116 of FIG. 7.

TABLE II

Pseudo Code for the Partitioning Function

1. SORT list of logic cones according to the functional clock phase which drives the apex
2. Initialize partition list (keeps track of which logic cones go into each partition)
3. LOOP through the list of logic cones not in a partition
4.   IF first cone
5.     Increment partition list count (create new partition)
6.     Add in the logic cone and note the apex clock phase
7.   ELSE IF apex latch has the same clock phase
8.     THEN (already cones in this partition list; see if this candidate cone can
9.       be added to this partition)
10.       Initialize a clock phase conflict list
11.     LOOP through inputs for this cone
12.       IF any input latch is the same latch as a cone apex already in the partition
13.         THEN
14.         Set a Reject flag
15.       ENDIF
16.       IF any input has the same functional clock phase as this apex THEN
17.         Add the input latch to the clock phase conflict list
18.         LOOP through cone inputs for this latch (third level inputs)
19.           -- Now at third level of logic. Level 1 is the apex latch; Level 2 is the input
20.           -- latch of the same functional clock phase; Level 3 is the latches which
21.           -- drive the clock or enable input of the Level 2 latch
22.           IF input to Clock of Enable THEN
23.             IF any (Level 3) input latch is the same as a cone apex already in the
24.               partition THEN
25.               Set the Reject flag
26.             ENDIF
27.           END IF
28.         END LOOP (through third level input list)
29.       END IF
30.       IF the Reject flag is not set THEN
31.         Add this logic cone to the list for this partition
32.       END IF
33.     END LOOP (through inputs of this cone)
34.   ELSE (cone with new clock phase, start a new partition)
35.     Increment partition list count (create new partition)
36.     Add in the logic cone and note the apex clock phase
37.   ENDIF (same clock phase.)
38. END LOOP (through list of logic cones.)
39. Go through the entire loop again if there are any logic cones "rejected"

Note that in the algorithm shown in Table II, a check is made to determine if any inputs al Level 3 of the logic design are the same as any cone apex latch already in the partition (See Line 23). It is desirable that the Level 3 inputs are not constrained when the ATPG attempts to create test patterns. The ATPG of the present invention sets these level 3 latches to ensure that the Level 2 latch does not get tic,eked at the same time as any apex latch in the partition that it drives. Hence, these Level 3 latches are set as part of an ATPG pattern so that the Level 2 latch is disabled (i.e., the clock is blocked), wherever it is important. This fulfills the MEG requirement goals.

The net list for a partition is extracted from the net list for the entire ASIC or Device Under Test (DUT) and given to Test Generation 148 and Fault Simulation 152. When Test Generation and Fault Simulation are complete on a partition, then the next partition's net list is input to these functions. Building a net list for a partition is an important step in the present invention for having an ATPG automatically create test patterns that ensure a MEG condition. The critical part of building a partition net list is identifying an input latch which has the same clock phase as an apex/output latch.

Table III shows the pseudo code for building a net list for a partition.

TABLE III

Pseudo Code for Building a Net List for a Partition

1. LOOP through the list of latches in a partition
2.   LOOP through the used node list for each latch
3.     IF node is an input latch THEN
4.       IF input latch has same clock phase as apex/outputs THEN
5.         Replace with 2-1 Select and an AND gate which drives the select input
6.         Put this node on MEG process list
7.       ELSE
8.         Replace with an input pin just as if this latch were an ASIC input pin)
9.       ENDIF
10.     ELSE IF node is an apex/output latch THEN
11.       Replace with 2-1 Select anti an AND gate which drives the select input
12.       Get driver to latch's clock input port. Connect to AND gate
13.       Get driver to latch's clock enable input port. Connect to AND gate
14.       Get driver to latch's data input port. Connect to D1 input of the 2-1 Select

TABLE III-continued

Pseudo Code for Building a Net List for a Partition

```
15.        Connect "this latch as an input pin" to the D0 input of the 2-1 Select
16.      ELSE (normal, combination node such as AND, OR, NOR, etc.)
17.        Get drivers to each input port and connect them
18.      ENDIF
19.    END LOOP (through latch used node list.)
20.  END LOOP (through list of latches in a partition)
21.  LOOP through MEG list
22.    LOOP through the used node list for each latch
23.      IF node is an input latch THEN
24.        IF input latch has same clock phase as apex/outputs THEN
25.          Level 3 clock phase conflict detected.
26.          Replace with an input pin and set that pin = "X"
27.        ELSE
28.          Replace with an input pin (just as if this latch were an ASIC input pin)
29.        ENDIF
30.      ELSE IF node is the Level 2 latch THEN
31.        Get driver to latch's clock input port. Connect to AND gate
32.        Get driver to latch's clock enable input port, Connect to AND gate
33.        Connect an "X" logic value to D1 input of the 2-1 Select
34.        Connect "this latch as an input pin" to the D0 input of the 2-1. Select
35.      ELSE (normal, combinational node such as AND, OR, NOR, etc.)
36.        Get drivers to each input port and connect them
37.      END IF
38.    END LOOP (through latch used node list)
39.  END LOOP (through MEG list)
```

Figure 9:
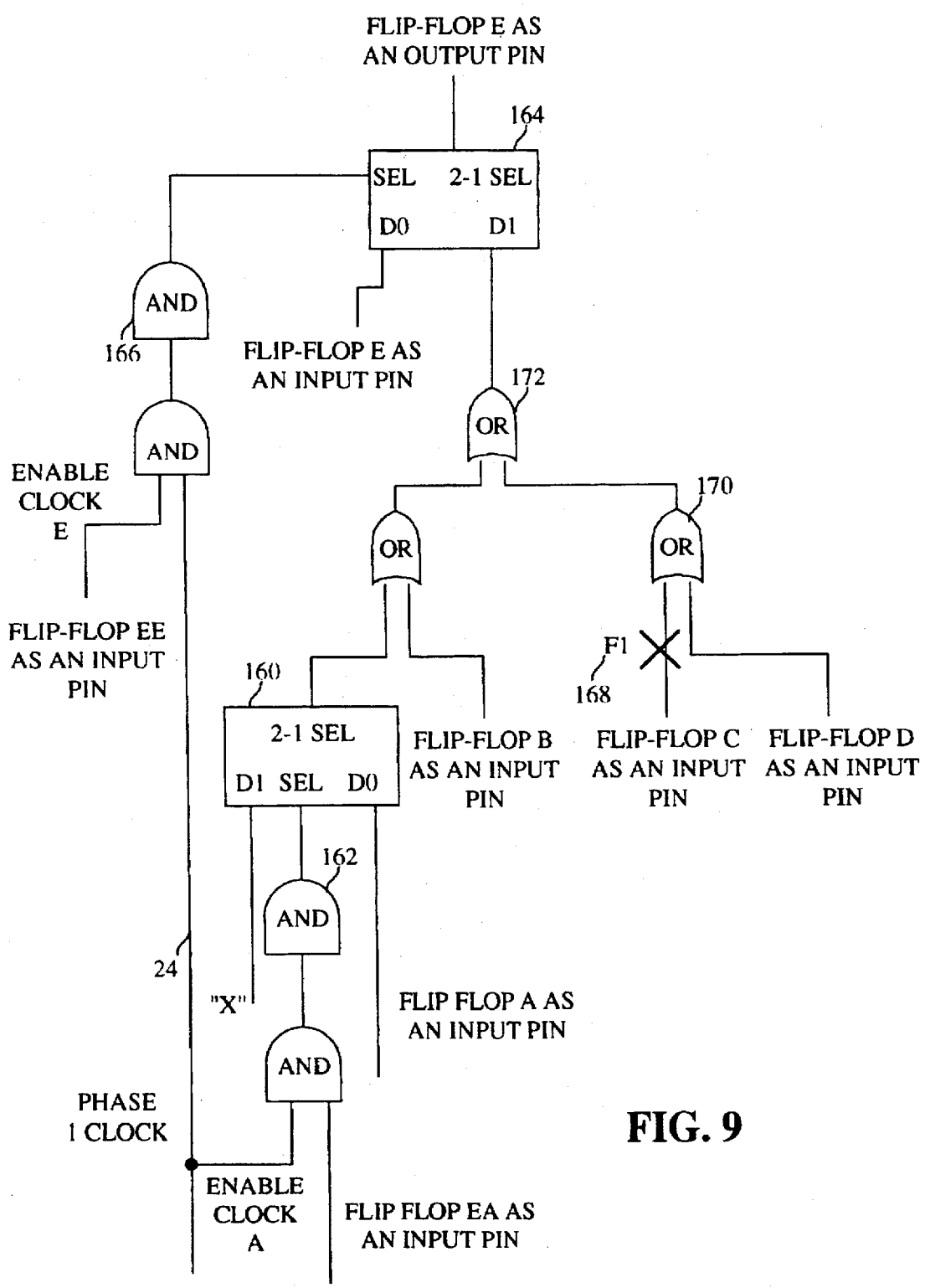
FIG. 9 is a diagram of the integrated circuit design example of FIG. 1 after cone tracing, partitioning, and net list building processing have been performed.

FIG. 9 is a diagram of the integrated circuit design example of FIG. 1 after cone tracing, partitioning, and net list building processing have been performed. Note that Flip-Flop A 14 has been replaced with a 2-1 Select 160 and an AND gate 162 because this latch has the same functional clock as the apex Flip-Flop E 12. Flip-Flop E 12 has been replaced with a 2-1 Select 164 and AND gate 166. Contrast this modification with how input Flip-Flop B 16, Flip-Flop C 18, and Flip-Flop D 20 are represented. The logic of FIG. 9 is changed in the ATPG internal data structures for test generation purposes only. No additional logic is actually added to the physical design of the integrated circuit.

Test Generation 148 is given a net list and a list of fault sites for each partition. In FIG. 9, a fault site F1 168 is represented (stuck-at-1). The goal of the Test Generation function is to pick a fault from the list of fault sites and create a test pattern that will excite the fault and propagate it to an output of the net list. When creating a pattern, Test Generation is only concerned with the current fault. If Test Generation 148 is successful, the pattern is sent to the Fault Simulation 152 function. Fault Simulation takes the test pattern, simulates it against the entire net list and finds all faults that the pattern detects. Detected faults are marked in the fault list and processing control is given back to Test Generation. In the present invention, the steps for identifying clock phase conflicts and creating a special network (as above for Flip-Flop A) for Test Generation allows it to automatically create a Mutually Exclusive Gating condition as part of normal pattern generation.

By examining the example of FIG. 9, one skilled in the art may readily understand how the present invention provides substantial benefits. Initially, the Test Generation function traces backward from the selected fault site F1 168. It sets the net to the opposite value of the assumed fault. In this example, the net is set to zero. This is accomplished by setting the input pin representing Flip-Flop C to 0. Next, the good machine value of "0" is propagated forward to an output. While doing this, OR gate 170 is the first mode encountered. To propagate a "0" forward, Test Generation must set all other inputs to OR gate 170 to "0". Further forward propagation uncovers the need to set the other input of OR gate 172 to "0" and the SEL input of Flip-Flop E 2-1 Select 164 must be set to "1". The D0 input to Flip-Flop E 2-1 Select 164 is a "don't care". All requirements are noted in a data structure called a boundary table. Test Generation then loops through the boundary table to fulfill the requirements. For the SEL input of Flip-Flop E 2-1Select 164, it ultimately discovers that a "1" is needed at Flip-Flop EE 22 as an input pin and at Phase 1 Clock pin 24. Test Generation also discovers that it needs a "0" at the output of Flip-Flop A 2-1 Select 160. The only way to get this is to set the SEL input to "0" and the D0 input to "0". The only way to get the SEL input to "0" is to set Flip-Flop EA 26 as input to "0".

Test Generation now has a pattern that will detect a stuck-at-1 fault at fault site F1 168. That test pattern has Flip-Flop EE 22 as input set to "1", Flip-Flops A, B, C, D, and EA as input pins set to "0", Clock pin X set to "1", and Flip-Flop E as an input pin set to "X" (don't care). Note that the pattern automatically blocks Phase 1 Clock pin 24 from latching/clocking data into Flip-Flop A 14. This is, in effect, Mutually Exclusive Gating. Prior art test systems would have treated Flip-Flop A as a simple input pin just like Flip-Flops B, C, D, and EE. As a result, Flip-Flop EA 26 would not be part of the logic that the ATPG program sees and its logic value would be "X" (don't care). One skilled in the art can see that leaving Flip-Flop EA as an "X" is very risky. When Phase 1 Clock pin 24 is pulsed during actual application of the ATPG pattern, the unknown functional data input to Flip-Flop A could get loaded. As stated above, other ATPG systems have an LSSD design requirement to eliminate this risk. The present system eliminates the manual handling of the MEG design requirement by automatically handling it during the ATPG process.

One skilled in the art will notice that while looping through the MEG list at lines 24-29 of Table III (Net List Building Function), the clock phase of the Level 3 input latches is checked. In the example of FIG. 9, this is Flip-Flop EA 26. If Flip-Flop EA was also driven by Phase 1 Clock pin 24, it would have been set to "X" as an input pin. The result, for this simple example, would have been that the stuck-at-1 fault F1 would be undetectable. In an actual integrated circuit design, Flip-Flop A and Flip-Flop E would have much more complicated clock enabling schemes, thus providing the ATPG with many more alternatives for creating a MEG condition as part of the test pattern. In summary, setting a Level 3 input latch to "X" rarely results in undetectable faults. Notice also that at lines 18–28 of Table II (Partitioning Function), one of the items checked before a logic cone is added to a partition is whether a Level 3 input latch is the same latch as an apex already in the partition. This check helps to eliminate any possible conflict between setting that latch as an input for MEG purposes and trying to clock data into that latch because it is also an output of the partition being tested.

The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended Claims.

I claim:

1. A method of generating a test pattern for testing an integrated circuit comprising the steps of:

(a) identifying a group of components and nets of the integrated circuit;

(b) identifying any clock phase conflicts inherent in said group;

(c) building a list of components and nets for said group such that said clock phase conflicts are eliminated for said group and no components or nets are added to the integrated circuit; and (d) generating test patterns for testing said group based on said list.

2. A system for generating a test pattern for testing an integrated circuit comprising:

first identification means for identifying a group of components and nets of the integrated circuit;

second identification means coupled to said first identification means for identifying any clock phase conflicts inherent in said group;

list building means coupled to said second identification means for building a list of components and nets for said group such that said clock phase conflicts are eliminated for said group and no components or nets are added to the integrated circuit; and test pattern generation means coupled to said list building means for generating test patterns for said group based on said list.

3. In a system used by a logic designer for designing a circuit, the circuit having at least one functional clock and a plurality of scan set latches, the system storing a detailed description of the circuit design, the detailed description including names for components and nets of the circuit, nets of the circuit including apex nets input to the circuit and apex nets output from the circuit, a method of satisfying mutually exclusive gating requirements during automatic test pattern generation processing without adding components and nets to the circuit, said method comprising the steps of:

(a) identifying a plurality of groups of logic from the circuit, each of said plurality of groups including a section of the circuit defined by a path from at least one logic designer-defined apex net to at least one logic designer-defined base net affecting said logic designer-defined apex net, said identifying step including identifying portions of said plurality of groups that include functional data, clock, and enable input nets;

(b) aggregating said groups into at least one collection of groups and identifying any clock phase conflicts, said clock phase conflicts occurring where an input scan set latch of a selected group is driven by a predetermined functional clock of the circuit and an apex scan set latch coupled to an apex net of said selected group is driven by said predetermined functional clock;

(c) building a list for said at least one collection, said list including components and nets for said at least one collection, and said list representing said at least one collection such that a mutually exclusive gating requirement is satisfied for each clock phase conflict identified in step (b) without adding components and nets to the circuit; and (d) automatically generating a valid test pattern for testing said at least one collection based on said list.

4. The method of claim 3, wherein said aggregating step (b) includes the step of determining whether a scan set latch of a first group and an input scan set latch of a second group are driven by said predetermined functional clock causing a clock phase conflict with an apex scan set latch of said second group, and aggregating said first group having said scan set latch into a different collection than said at least one collection having said secured group including said input scan set latch and said apex scan set latch.

5. The method of claim 3, wherein said building a list step (c) includes the steps of replacing any input scan set latch causing a clock phase conflict with a first 2-1 selector and an AND gate driving said first 2-1 selector's input in said list, and replacing any input scan set latch not causing a clock phase conflict with an input pin in said list.

6. The method of claim 3, wherein said building a list step (c) includes the step of replacing an apex scan set latch with a second 2-1 selector and an AND gate driving said second 2-1 selector's input in said list.

7. A system used by a logic designer in designing a circuit for satisfying mutually exclusive gating requirements during automatic test pattern generation processing without adding components and nets to the circuit, the circuit having at least one functional clock and a plurality of scan set latches, the circuit being defined by a detailed description including names for components and nets of the circuit, nets of the circuit including base nets input to the circuit and apex nets output from the circuit, the system comprising:

tracing means for identifying a plurality of groups of logic from the circuit, each of said plurality of groups including a section of the circuit defined by a path from at least one logic designer-defined apex net to at least one logic designer-defined base net affecting said logic designer-defined apex net, said tracing means including means for identifying portions of said plurality of groups that include functional data, clock, and enable input nets;

partitioning means coupled to said tracing means for aggregating groups into at least one collection and for identifying clock phase conflicts inherent in the circuit, said clock phase conflicts existing where an input scan set latch of a selected group is driven by a predetermined functional clock of the circuit and an apex scan set latch coupled to an apex net of said selected group is driven by said predetermined functional clock;

list building means coupled to said partitioning means for building a list of components and nets for said at least one collection, said list representing said at least one collection so that test patterns can be automatically generated for testing said at least one collection and mutually exclusive gating requirements are satisfied for said clock phase conflicts identified by said partitioning means without adding components and nets to the circuit.

8. The system of claim 7, further including test pattern generation means coupled to said list building means for automatically generating test patterns for said at least one collection based on said list.

9. The system of claim 7, wherein said partitioning means includes first means for determining when a scan set latch of a first group is driven by a predetermined functional clock and an input scan set latch of a second group is driven by said predetermined functional clock causing a clock phase conflict with an apex scan set latch of said second group, and second means for aggregating said first group having said scan set latch into a different collection than said collection having said second group including said input scan set latch and said apex scan set latch.

10. The system of claim 7, wherein said list building means includes first replacing means for replacing any input scan set latch causing a clock phase conflict with a first 2-1 selector and an AND gate driving said first 2-1 selector's input in said list, and second replacing means for replacing any input scan set latch not causing a clock phase conflict with an input pin in said list.

11. The system of claim 10, wherein said list building means includes third replacing means for replacing an apex scan set latch with a second 2-1 selector and an AND gate driving said second 2-1 selector's input in said list.

12. In an electronic design automation system used by a logic designer for designing an integrated circuit, the integrated circuit having at least one functional clock and a plurality of scan set latches, the electronic design automation system including a computerized integrated circuit design database for storing a gate level description of the integrated circuit, the gate level description including names for components and nets of the integrated circuit, nets of the integrated circuit including base nets input to the integrated circuit and apex nets output from the integrated circuit, base nets being coupled to input scan set latches and apex nets being coupled to apex scan set latches, a computer-implemented method of automatically generating test patterns while satisfying mutually exclusive gating requirements without adding components and nets to the integrated circuit, said computer-implemented method comprising the steps of:

(a) electronically reading the gate level description of the integrated circuit's design from the computerized integrated circuit design database;

(b) analyzing the gate level description and identifying a plurality of cones of logic from the integrated circuit, each of said plurality of cones including a section of the integrated circuit's design defined by a path from at least one logic designer-defined apex net to at least one logic designer-defined base net affecting said logic designer-defined apex net, said analyzing and identifying step including identifying portions of said plurality of cones that include functional data, clock, and enable input nets;

(c) grouping cones of logic design into partitions and identifying any clock phase conflicts, said clock phase conflicts occurring where an input scan set latch of a selected cone is driven by a predetermined functional clock of the integrated circuit and an apex scan set latch coupled to an apex net of said selected cone is driven by said predetermined functional clock;

(d) building a net list for each of said partitions, said net lists including components and nets of the integrated circuit for each of said partitions, and said net lists representing said partitions such that a mutually exclusive gating requirement is satisfied for each clock phase conflict identified in step (c) without adding components and nets to the integrated circuit's design;

(e) automatically generating test patterns for detecting stuck-at faults for each of said partitions based on said net lists; and (f) electronically writing said test patterns into the computerized integrated circuit design database.

13. The computer-implemented method of claim 12, wherein said grouping step (c) includes the step of determining when a scan set latch of a first cone and an input scan set latch or a second cone are driven by said predetermined functional clock causing a clock phase conflict with an apex scan set latch of said second cone, and grouping said first cone having said scan set latch into a different partition than said partition having said second cone including said input scan set latch and said apex scan set latch.

14. The computer-implemented method of claim 12, wherein said building a net list step (d) includes the steps of replacing any input scan set latch causing a clock phase conflict with a first 2-1 selector and an AND gate driving said first 2-1 selector's input in said net lists for test generation processing, and replacing any input scan set latch not causing a clock phase conflict with an input pin in said net lists for test generation processing.

15. The computer-implemented method of claim 14, wherein said building a net list step (d) includes the step of replacing an apex scan set latch with a second 2-1 selector and an AND gate driving said second 2-1 selector's input in said net lists for test generation processing.

16. An automatic test pattern generation system used by a logic designer for generating test patterns for testing a digital integrated circuit while satisfying mutually exclusive gating requirements without adding components and nets to the digital integrated circuit's design, the digital integrated circuit having at least one functional clock and a plurality of scan set latches, the automatic test pattern generation system comprising:

a computerized digital integrated circuit design database for storing a gate level description of the digital integrated circuit's design, said gate level description including names for components and nets of the digital integrated circuit, nets of the digital integrated circuit including base nets input to the digital integrated circuit and apex nets output from the digital integrated circuit, base nets being coupled to input scan set latches and apex nets being coupled to apex scan set latches;

reading means coupled to said computerized digital integrated circuit design database for electronically reading said gate level description from said computerized digital integrated circuit design database;

cone tracing means coupled to said reading means for analyzing said gate level description and for identifying a plurality of cones of logic from the digital integrated circuit, each of said plurality of cones including a section of the digital integrated circuit's design defined by a path from at least one logic designer-defined apex net to at least one logic designer-defined base net affecting said logic designer-defined apex net, said analyzing and identifying means including means for identifying portions of said plurality of cones that include functional data, clock, and enable input nets;

partitioning means coupled to said cone tracing means for grouping said cones into partitions and for identifying any clock phase conflicts, said clock phase conflicts occurring where an input scan set latch of a selected cone is driven by a predetermined functional clock of the digital integrated circuit and an apex scan set latch coupled to an apex net of said selected cone is driven by said predetermined functional clock;

net list building means coupled to said partitioning means for building a net list for each of said partitions, said net lists including components and nets of the digital integrated circuit for each of said partitions, and said net lists representing said partitions such that a mutually exclusive gating requirement is satisfied for each clock phase conflict identified by said partitioning means without adding components and nets to the digital integrated circuit's design;

test pattern generation means coupled to said net list building means for automatically generating test patterns for detecting stuck-at faults for each of said partitions based on said net lists; and writing means coupled to said test pattern generation means and said computerized digital integrated circuit design database for electronically storing said test patterns into the computerized integrated circuit design database.

17. The automatic test pattern generation system of claim 16, wherein said partitioning means includes means for determining when a scan set latch of a first cone is driven by said predetermined functional clock and an input scan set latch of a second cone is driven by said predetermined functional clock causing a clock phase conflict with an apex scan set latch of said second cone, and means for grouping said first cone having said scan set latch into a different partition than said partition having said second cone including said input scan set latch and said apex scan set latch.

18. The automatic test pattern generation system of claim 16, wherein said net list building means includes first replacing means for replacing any input scan set latch causing a clock phase conflict with a first 2-1 selector and an AND gate driving said first 2-1 selector's input in said net lists for test generation processing, and second replacing means for replacing any input scan set latch not causing a clock phase conflict with an input pin in said net lists for test generation processing.

19. The automatic test pattern generation system of claim 18, wherein said net list building means includes third replacing means for replacing an apex scan set latch with a second 2-1 selector and an AND gate driving said second 2-1 selector's input in said net lists for test generation processing.

20. In a computerized electronic design automation system used by a logic designer for designing an application specific integrated circuit (ASIC), the logic designer adhering to Level Sensitive Scan Design (LSSD) rules, the ASIC having at least one functional clock and a plurality of scan set latches, the computerized electronic design automation system including a computerized ASIC design database for storing a gate level description of the ASIC's logic design, the gate level description including names for components and nets of the ASIC, nets of the ASIC including base nets input to the ASIC and apex nets output from the ASIC, base nets being coupled to input scan set latches and apex nets being coupled to apex scan set latches, a method of operating a computer for automatically generating test patterns while satisfying mutually exclusive gating requirements without adding components and nets to the ASIC's logic design, said method comprising the steps of:

(a) electronically reading the gate level description of the ASIC's logic design from the computerized ASIC design database;

(b) analyzing the gate level description and identifying a plurality of cones of logic from the ASIC, each of said plurality of cones including a section of the ASIC's design defined by a path from at least one logic designer-defined apex net to at least one logic designer-defined base net affecting said logic designer-defined apex net, said analyzing and identifying step including identifying portions of said plurality of cones that include functional data, clock, and enable input nets;

(c) grouping said cones into partitions and identifying any clock phase conflicts, said clock phase conflicts occurring where an input scan set latch of a selected cone is driven by a predetermined functional clock of the ASIC and an apex scan set latch coupled to an apex net of said selected cone is driven by said predetermined functional clock, said grouping step including the step of determining when a scan set latch of a first cone is driven by said predetermined functional clock and an input scan set latch of a second cone is driven by said predetermined functional clock causing a clock phase conflict with an apex scan set latch of said second cone, and grouping said first cone having said scan set latch into a different partition than said partition having said second cone including said input scan set latch and said apex scan set latch;

(d) building a net list for each of said partitions, said net lists including components and nets of the ASIC for each of said partitions, and said net lists representing said partitions such that a mutually exclusive gating requirement is satisfied for each clock phase conflict identified in step (c) without adding components and nets to the ASIC's design, said building a net list step including the steps of (d1) replacing, for test generation processing, any input scan set latch causing a clock phase conflict with a first 2-1 selector and an AND gate driving said first 2-1 selector's input in said net lists;

(d2) replacing, for test generation processing, any input scan set latch not causing a clock phase conflict with an input pin in said net lists; and (d3) replacing, for test generation processing, an apex scan set latch with a second 2-1 selector and an AND gate driving said second 2-1 selector's input in said net lists;

(e) automatically generating test patterns for detecting stuck-at faults for each of said partitions based on said net lists; and (f) electronically writing said test patterns into the computerized ASIC design database.

21. In a electronic design automation system used by a logic designer for designing an application specific integrated circuit (ASIC), the logic designer adhering to Level Sensitive Scan Design (LSSD) rules, the ASIC having at least one functional clock and a plurality of scan set latches, an automatic test pattern generation system used by the logic designer for generating test patterns for testing an ASIC while satisfying mutually exclusive gating requirements without adding components and nets to the ASIC's design, the ASIC having at least one functional clock and a plurality of scan set latches, the automatic test pattern generation system comprising:

a computerized ASIC design database for storing a gate level description of the ASIC's logic design, said gate level description including names for components and nets of the ASIC, nets of the ASIC including base nets input to the ASIC and apex nets output from the ASIC, base nets being coupled to input scan set latches and apex nets being coupled to apex scan set latches;

reading means coupled to said computerized ASIC design database for electronically reading said gate level description from said computerized ASIC design database;

cone tracing means coupled to said reading means for analyzing said gate level description and for identifying a plurality of cones of logic from the ASIC, each of said plurality of cones including a section of the ASIC's design defined by a path from at least one logic designer-defined apex net to at least one logic designer-defined base net affecting said logic designer-defined apex net, said analyzing and identifying means including means for identifying portions of said plurality of cones that include functional data, clock, and enable input nets;

partitioning means coupled to said cone tracing means for grouping cones into partitions and for identifying any clock phase conflicts, said clock phase conflicts occurring where an input scan set latch of a selected cone is driven by a predetermined functional clock of the ASIC and an apex scan set latch coupled to an apex net of said selected cone is driven by said predetermined functional clock, said partitioning means including first means for determining when a scan set latch of a first cone is driven by said predetermined functional clock and an input scan set latch of a second cone is driven by said predetermined functional clock causing a clock phase conflict with an apex scan set latch of said second cone; and second means for grouping said first cone having said scan set latch into a different partition than said partition having said second cone including said input scan set latch and said apex scan set latch;

net list building means coupled to said partitioning means for building a net list for each of said partitions, said net lists including components and nets of the ASIC for each of said partitions, and said net lists representing said partitions such that a mutually exclusive gating requirement is satisfied for each clock phase conflict identified by said partitioning means without adding components and nets to the ASIC's design; said net list building means including first replacing means for replacing any input scan set latch causing a clock phase conflict with a first 2-1 selector and an AND gate driving said first 2-1 selector's input in said net lists for test generation processing;

second replacing means for replacing any input scan set latch not causing a clock phase conflict with an input pin in said net lists for test generation processing; and third replacing means for replacing an apex scan set latch with a second 2-1 selector and an AND gate driving said second 2-1 selector's input in said net lists for test generation processing;

test pattern generation means coupled to said net list building means for automatically generating test patterns for detecting stuck-at faults for each of said partitions based on said net lists; and writing means coupled to said test pattern generation means and said computerized ASIC design database for electronically storing said test patterns into the computerized integrated circuit design database.

22. In an electronic design automation system used by a logic designer for designing an integrated circuit, the integrated circuit having at least one functional clock and a plurality of scan set latches, the electronic design automation system including a computerized integrated circuit design database for storing a gate level description of the integrated circuit's design, the gate level description including names for components and nets of the integrated circuit, nets of the integrated circuit including base nets input to the integrated circuit and apex nets output from the integrated circuit, base nets being coupled to input scan set latches and apex nets being coupled to apex scan set latches, an automatic test pattern generation system for automatically generating test patterns while satisfying mutually exclusive gating requirements without adding components and nets to the integrated circuit's design comprising:

a processor;

a storage device coupled to said processor for storing the computerized integrated circuit design database; and software means operative on said processor to automatically generate test patterns by:

(a) electronically reading the gate level description of the integrated circuit's design from the computerized integrated circuit design database;

(b) analyzing the gate level description and identifying a plurality of cones of logic from the integrated circuit, each of said plurality of cones including a section of the integrated circuit's design defined by a path from at least one logic designer-defined apex net to at least one logic designer-defined base net affecting said logic designer-defined apex net, said analyzing and identifying step including identifying portions of said plurality of cones that include functional data, clock, and enable input nets;

(c) grouping said cones into partitions and identifying any clock phase conflicts, said clock phase conflicts occurring where an input scan set latch of a selected cone is driven by a predetermined functional clock of the integrated circuit and an apex scan set latch coupled to an apex net of said selected cone is driven by said predetermined functional clock of the integrated circuit;

(d) building a net list for each of said partitions, said net lists including components and nets of the integrated circuit for each of said partitions, and said net lists representing said partitions such that a mutually exclusive gating requirement is satisfied for each clock phase conflict identified in step (c) without adding components and nets to the integrated circuit's design;

(e) automatically generating test patterns for detecting stuck-at faults for each of said partitions based on said net lists; and (f) electronically writing said test patterns into the computerized integrated circuit design database.

* * * * *